United States Patent
Kasa et al.

(10) Patent No.: US 6,501,330 B2
(45) Date of Patent: *Dec. 31, 2002

(54) SIGNAL PROCESSING SEMICONDUCTOR INTEGRATED CIRCUIT DEVICE

(75) Inventors: Nobuhiro Kasa, Tano (JP); Yoshiyasu Tashiro, Takasaki (JP); Kazuaki Hori, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/087,820

(22) Filed: Mar. 5, 2002

(65) Prior Publication Data

US 2002/0079958 A1 Jun. 27, 2002

Related U.S. Application Data

(63) Continuation of application No. 09/789,566, filed on Feb. 22, 2001, now Pat. No. 6,384,676.

(30) Foreign Application Priority Data

Feb. 29, 2000 (JP) ........................................ 2000-053620

(51) Int. Cl.[7] .............................................. H01L 25/00
(52) U.S. Cl. ........................................ 327/565; 257/499
(58) Field of Search ................................. 327/364, 365, 327/565; 326/101; 257/499, 500, 501, 508, 517, 371, 373, 565

(56) References Cited

U.S. PATENT DOCUMENTS

| | | | |
|---|---|---|---|
| 4,819,052 A | 4/1989 | Hutter | 257/378 |
| 4,887,144 A * | 12/1989 | Cook et al. | 257/513 |
| 4,939,567 A * | 7/1990 | Kenney | 257/377 |
| 4,963,957 A | 10/1990 | Ohi et al. | 257/508 |
| 4,977,439 A * | 12/1990 | Esquivel et al. | 257/397 |
| 5,283,461 A | 2/1994 | Beasom | 257/508 |

FOREIGN PATENT DOCUMENTS

| | | |
|---|---|---|
| JP | 5-13561 | 1/1993 |
| JP | 7-263539 | 10/1995 |

* cited by examiner

*Primary Examiner*—Timothy P. Callahan
*Assistant Examiner*—Linh Nguyen
(74) *Attorney, Agent, or Firm*—Mattingly, Stanger & Malur, P.C.

(57) ABSTRACT

A semiconductor integrated circuit comprising a first circuit block including an oscillation circuit considered to be a noise generator and a second circuit block including circuits considered to be easily affected by a noise generated by the oscillation circuit, being most likely led to a malfunction are created on a single semiconductor substrate with the first and second circuit blocks separated from each other. To put it more concretely, the first and second circuit blocks are respectively created in a first island area and a second island area on the surface of the semiconductor substrate. The first and second island areas are each enclosed by an insulating isolation band. A low-resistance semiconductor area is created in a base area excluding locations occupied by active elements in the first and second island areas and is connected to a stable voltage terminal.

16 Claims, 11 Drawing Sheets

SIGNAL PROCESSING SEMICONDUCTOR INTEGRATED CIRCUIT DEVICE

This is a continuation application of U.S. Ser. No. 09/789,566, filed Feb. 22, 2001, now U.S. Pat. No 6,384,676.

BACKGROUND OF THE INVENTION

The present invention relates to a technology of reducing cross talk in a semiconductor integrated circuit and a technology effectively applicable to a signal-processing LSI (or a large-scale semiconductor integrated circuit) for receiving and processing signals in a plurality of different frequency bands. More particularly, the present invention relates to a technology effectively applicable to a radio-communication LSI employed typically in a hand phone for processing a signal received by adoption of a super-heterodyne technique.

As a radio-communication system adopted in a hand phone, there is known a radio-communication system embracing the super-heterodyne technique as shown in FIG. 11. In the radio-communication system shown in FIG. 11, reference numeral 100 denotes an antenna for receiving a signal wave and reference numeral 101 denotes a reception/transmission changeover switch. Reference numeral 110 denotes a reception-system circuit for amplifying the signal received by the antenna 100 and demodulating the amplified signal. Reference numeral 120 denotes a transmission-system circuit for modulating a signal to be transmitted through the antenna 100 and converting the frequency of the signal. Reference numeral 130 is an oscillation-system circuit for generating a local oscillation signal required by the reception-system circuit 110 and the transmission-system circuit 120. Reference numeral 140 denotes a base-band-signal-processing circuit for carried out processing such as extraction of audio data from a signal received by the antenna 100 and conversion of the audio data into a train of voltage pulses. Reference numeral 150 is a system controller including a microcomputer for totally controlling the entire radio-communication system. The transmission/reception changeover switch 101 is controlled by a control signal TX/RX output by the system controller 150 to switch the mode of the radio-communication system from reception to transmission and vice versa.

The reception-system circuit 110 comprises a band-limiting filter (FLT) 111, a low-noise amplification circuit (LNA) 112, a down-conversion mixer (MIX) 113, a band-pass filter (BPF) 114, a programmable-gain amplifier (PGA) 115 and a demodulator (DeMOD) 116. The FLT 111 is typically an SAW filter for removing unnecessary waves from a signal received by the antenna 100. The LNA 112 is an amplifier for amplifying a signal passing through the band-limiting filter (FLT) 111. The MIX 113 is a converter for down-converting the frequency of the signal amplified by the amplification circuit (LNA) 112 into an intermediate frequency by mixing the signal with the local oscillation signal generated by the oscillation-system circuit 130. The BPF 114 is a filter for passing through a signal having the frequency corresponding to a difference in frequency between the signal amplified by the amplification circuit (LNA) 112 and the local oscillation signal. The programmable-gain amplifier (PGA) 115 is an amplifier capable of controlling a gain at which a signal output by the band-pass filter (BPF) 114 is amplified thereby to a desired level. The DeMOD 116 is a demodulator for modulating the signal with the amplitude thereof adjusted by the programmable-gain amplifier (PGA) 115 to a desired level into a base-band signal (I/Q).

The transmission-system circuit 120 comprises a modulator (MOD) 121, an up-conversion mixer (U-MIX) 122 and a power amplifier (PA) 123. The MOD 121 is a modulator for modulating a signal to be transmitted into an RF (radio frequency) signal. The signal to be transmitted is received from the base-band-signal-processing circuit 140 as a base-band signal (I/Q). The mixer (U-MIX) 122 is a converter for up-converting the frequency of the signal obtained as a result of modulation by the modulator (MOD) 121 into a desired transmission frequency by mixing the modulated signal with the local oscillation signal generated by the oscillation-system circuit 130. The PA 123 is an amplifier for amplifying the power of the signal to be transmitted after the frequency conversion prior to a transmission by way of the antenna 100.

The oscillation-system circuit 130 comprises a radio-frequency voltage-controlled oscillation circuit (RFVCO) 132, an intermediate-frequency voltage-controlled oscillation circuit (IFVCO) 131, a synthesizer (SYN) 133 and a buffer (BFF) 134. The RFVCO 132 is a voltage-controlled oscillation circuit for generating an RF (radio frequency) signal used in the down-conversion mixer (MIX) 113 and the up-conversion mixer (U-MIX) 122. On the other hand, the intermediate-frequency voltage-controlled oscillation circuit (IFVCO) 131 is a voltage-controlled oscillation circuit for generating an IF (intermediate frequency) signal, that is, a signal with a fixed frequency, required by the demodulator (DeMOD) 116 and the modulator (MOD) 121. The SYN 133 is a synthesizer for generating control voltages applied to the radio-frequency voltage-controlled oscillation circuit (RFVCO) 132 and the intermediate-frequency voltage-controlled oscillation circuit (IFVCO) 131 respectively. The control voltage applied to each of the VCO 131 and VCO 132 is generated in accordance with a difference in phase between a feedback signal generated by the VCO 131 and VCO 13 and a reference signal TCXO generated by an oscillation circuit employing a crystal oscillator exhibiting characteristics of high frequency precision and little temperature dependence. The difference in phase is obtained as a result of comparing the feedback signal with the reference signal TCXO. The BFF 134 is a buffer for supplying an oscillation signal generated by the RFVCO 132 to the down-conversion mixer (MIX) 113 employed in the reception-system circuit 110 and the up-conversion mixer (U-MIX) 122 employed in the transmission-system circuit 120 by proper distribution. It should be noted that the synthesizer (SYN) 133 and the radio-frequency voltage-controlled oscillation circuit (RFVCO) 132 constitute a closed-loop circuit known as a PLL (Phase Locked Loop) circuit. Similarly, the synthesizer (SYN) 133 and the intermediate-frequency voltage-controlled oscillation circuit (IFVCO) 131 constitute another closed-loop circuit also known as a PLL (Phase Locked Loop) circuit.

SUMMARY OF THE INVENTION

The radio-communication system shown in FIG. 11 comprises about 10 IC chips each implemented as a semiconductor integrated circuit. The IC chips are units of integration implementing the circuit blocks 112, 113, 115, 116 and so on. If the radio-communication system for processing transmitted and received signals comprises a plurality of IC chips, the number of components rises, inevitably increasing an area for mounting the components. For a portable electronic device such as a hand phone, however, a small size and low power consumption are mandatory requirements.

Thus, reduction of the component count is a technological challenge of importance.

In order to reduce the number of components such as ICs composing the radio-communication system of a hand phone, inventors of the present invention developed an LSI allowing some of several circuit blocks shown in FIG. 11 to be integrated into a single semiconductor chip. FIG. 12 is a diagram showing a layout of circuit blocks initially considered to be put in the LSI. Circuit blocks of FIG. 12 identical with those shown in FIG. 11 are denoted by the same reference numerals as the latter. A comparison of FIG. 11 with FIG. 12 clearly indicates that circuit blocks shown in FIG. 12 are merely laid out along flows of received and transmitted signals as is the case with those shown in FIG. 11.

By simply arranging the circuit blocks into a layout on a semiconductor chip as shown in FIG. 12, however, a result of an interference-wave test clearly indicated a deteriorating CN (component to noise) ratio. To put it concretely, the result of the test indicated that, when an interference wave with an interfering frequency was introduced at −26 dB to a desired signal input through the antenna at −99 dB, the CN ratio deteriorated, causing a bit error rate to exceed a desirable level.

In order to solve the problem described above, the inventors of the present invention studied causes of the deterioration of the CN ratio accompanying introduction of an interference wave. Results of the study are explained as follows.

FIG. 13 is a diagram showing a frequency distribution of an interference wave and a desired wave with a deteriorated CN ratio caused by introduction of the interference wave. In FIG. 13, notations fW and fB denote a desired wave (or a received wave) and an interference wave respectively whereas notation fRELO denotes the RF (radio frequency) local oscillation signal to be mixed with the received signal (or the desired signal) in the down-conversion mixer (MIX) 113 shown in FIG. 12. Notation fIFW denotes a desired wave obtained as a result of frequency down conversion by mixing the RF local oscillation signal with the received signal. Notation fIFLO is an IF (intermediate frequency) signal generated by the intermediate-frequency voltage-controlled (IFVCO) 131. The frequency of the signal fIFLO is an intermediate frequency of typically 540 MHz.

Assume that the frequency of the desired wave fW is 940 MHz and the frequency of the RF local oscillation signal fRFLO is 1,165 MHz. In this case, in the down-conversion mixer (MIX) 113 converts the desired wave fW into the signal fIFW with an intermediate frequency of 225 MHz (=1,165 MHz −940 MHz). In this state, when an interference wave fB with a frequency of 935 MHz is received, noise components fN1 and fN2 appear as shown in FIG. 13.

The band-pass filter (BPF) 114 is capable of removing the noise component fN1 but not the noise component fN2. This is because the noise component fN2 has all but the same frequency as the signal fIFW's intermediate frequency of 225 MHz obtained as a result of the down conversion by the down-conversion mixer (MIX) 113. From this consideration, the deterioration of the CN ratio is thought to be caused by the noise component fN2. As shown in FIG. 12, the intermediate-frequency voltage-controlled oscillation circuit (IFVCO) 131 is put in the same LSI as the down-conversion mixer (MIX) 113. In this case, it is feared that a noise caused by cross talk propagates from the intermediate-frequency voltage-controlled oscillation circuit (IFVCO) 131 to the down-conversion mixer (MIX) 113 through a semiconductor substrate, causing the CN ratio to deteriorate.

In order to solve the problem described above, the inventors of the present invention conceive that a noise component is a spurious noise obtained as result of mixing the interference wave, the local oscillation signals and the intermediate-frequency signals or mixing higher harmonics of the interference wave, the local oscillation signals and the intermediate-frequency signals. That is, the frequency fN of a noise component can be expressed as follows:

$$fN = A*fRFLO \pm B*fIFLO \pm C*fB$$

where the symbols A, B and C are each an integer whereas the symbol * denotes a multiplication operator. If 1,165 MHz, 540 MHz and 935 MHz are substituted for the RF local oscillation frequency fRFLO, the IF local oscillation frequency fIFLO and the interference-wave frequency fB respectively whereas −2, 3 and 1 are substituted for the integers A, B and C respectively in the above equation, the intermediate frequency fN of the noise component is found to be 225 MHz. That is, the inventors of the present invention came to a conclusion that a noise component is indeed an intermediate-frequency spurious noise obtained as result of a synthesis of the interference wave, the local oscillation signals and the intermediate-frequency signals or a synthesis of higher harmonics of the interference wave, the local oscillation signals and the intermediate-frequency signals. At a development stage, the inventors of the present invention thought that, by mounting an LSI comprising circuit blocks like the ones shown in FIG. 12 on an SOI (Silicon on Insulator) substrate, it would be possible to reduce noise caused by cross talk propagating through the substrate. The inventors of the present invention also discovered, however, that the spurious noise could not be sufficiently reduced by merely using an SOI substrate.

In addition, as an application of the LSI described above, a signal-processing circuit to be used in a radio communication system adopting a single super-heterodyne technique has been assumed. If a double super-heterodyne technique is adopted, however, the number of local oscillation signals used in down conversion rises, increasing the number of mixing combinations of the local oscillation signals and the desired signal (received signal) or mixing combinations of higher harmonics of the local oscillation signals and the desired signal. An increased number of such combinations may result in more spurious noises giving rise to a problem of concern that there are more frequent cases in which the frequency of a spurious noise happens to almost coincide with the frequency of a signal obtained as a result a down conversion of a received signal, causing the CN ratio to deteriorate. It should be noted that the double super-heterodyne technique is a method whereby an intermediate-frequency signal obtained as a result of a down conversion of a received signal is further subjected to another down conversion by using a second mixer to generate a signal with en even lower frequency.

It is thus an object of the present invention to provide a signal-processing semiconductor integrated circuit that is used in a radio-communication system for signal processing to convert the frequency of a received signal (or a desired signal) into a lower frequency by mixing the received signal with a local oscillation signal, and is capable of reducing a CN ratio's deterioration caused by a spurious noise.

It is another object of the present invention to provide a semiconductor integrated circuit for radio communication capable of reducing deterioration of a CN ratio.

The above and other objects of the present invention as well as novel features thereof will become apparent from a careful study of this specification with reference to accompanying diagrams.

An outline of representatives of the present invention disclosed in this specification is described as follows.

In a semiconductor integrated circuit obtained as a result of formation of a first circuit block and a second circuit block on a semiconductor substrate, the first and second circuit blocks are created respectively in a first island area and a second island area on the surface of the semiconductor substrate wherein the first and second island areas are each enclosed by an insulating isolation band; a semiconductor area having a resistance lower than a base-substance area is created on the base-substance area, which is an area excluding a region for forming active elements on the first island area and excluding a region for forming active elements on the second island area; and the semiconductor area having a relatively low resistance is connected to a voltage terminal.

Since the insulating isolation band for electrically separating the first and second circuit blocks from each other functions as capacitors at high frequencies, the circuit blocks appear to be connected to each other by the capacitors. By virtue of the arrangement described above, however, the coupling capacitance between the first and second circuit blocks decreases since the coupling capacitors are connected to each other in series. Thus, the number of cross-talk components propagating from the first circuit block to the second circuit block can be reduced. As a result, bad effects of noises can also be decreased as well.

In addition, it is desirable to form a relatively-low-resistance semiconductor area for separating the first and second circuit blocks from each other in parallel to mutually interfacing boundaries on the first and second island areas in a region between the first and second island areas and to connect the relatively-low-resistance semiconductor area to a voltage terminal wherein the resistance of the relatively-low-resistance semiconductor area for separating the first and second circuit blocks is made lower than the resistance of the region between the first and second island areas. In this way, the electric potential of a semiconductor base substance between the first and second circuit blocks is fixedly firmed, making it difficult for a noise to propagate from the first circuit block to the second one.

Furthermore, the first circuit block includes an oscillation circuit, and a third island area enclosed by an insulating isolation band is created in a region between the first and second island areas. In the third island area, there is created a third circuit block, which is a collection of circuits pertaining to neither a category of circuits each considered to be most likely a noise generator nor a category of circuits each possibly malfunctioning due to propagation of a noise. In addition, a semiconductor area having a resistance lower than a base-substance area is created on a base-substance area, which is an area excluding a region for forming active elements on the third island area, and is connected to a voltage terminal. In this way, the third island area, in which the third circuit block is formed, executes functions similar to the relatively-low-resistance semiconductor area for separating the first and second block circuits from each other. As a result, the electric potential of a semiconductor base substance between the first and second circuit blocks is fixedly firmed, making it difficult for a noise to propagate from the first circuit block to the second one.

Moreover, the semiconductor substrate is an SOI substrate in which a semiconductor layer is created on a support substrate, being separated from the support substrate by an insulating layer. The island areas described above are formed on the semiconductor layer. It is preferable to create the insulating isolation band described above by having the band penetrate the semiconductor layer to the insulating layer. In this way, a semiconductor area including a circuit considered to be most likely a noise generator is cut off from a semiconductor area including a circuit easily hurt by a bad effect of a noise, being most likely led to a malfunction by the insulating isolation band. As a result, the quantity of noise and the number of noises propagating through the semiconductor base substance can be reduced.

In addition, the active elements described above are each a vertical-type bipolar transistor with the collector thereof implemented by a relatively-low-resistance embedded semiconductor region formed by embedding the region in the semiconductor layer. It is preferable to create the relatively-low-resistance embedded semiconductor region by using the same process as the semiconductor area as described above. As a result, a noise-proof semiconductor integrated circuit can be implemented without a need to newly add a process.

To put it concretely, a configuration of a signal-processing semiconductor integrated circuit includes:

a first oscillation circuit for generating a first oscillation signal;

a second oscillation circuit for generating a second oscillation signal;

an oscillation control circuit for generating control voltages applied to the first and second oscillation circuits respectively;

a first mixer circuit for converting the frequency of a signal received by an antenna by mixing the received signal with the first oscillation signal;

an amplification circuit for amplifying a signal with a frequency obtained as a result of frequency conversion carried out by the first mixer circuit;

a demodulation circuit for demodulating a signal obtained as a result of amplification carried out by the amplification circuit; and a second mixer circuit for converting the frequency of a signal to be transmitted by the antenna by mixing the signal to be transmitted with the second oscillation signal, wherein at least a first group of circuits and a second group of circuits are mounted on a semiconductor substrate by separating them from each other where the first group of circuits comprises the first mixer circuit and the first oscillation circuit whereas the second group of circuits comprises the second oscillation circuit, the amplification circuit and the demodulation circuit. As a result, it is possible to prevent the CN ratio in the first mixer from deteriorating due to a spurious noise generated by the second oscillation circuit.

If there are further provided a modulation circuit for generating the to-be-transmitted signal to be mixed by the second mixer with the second oscillation signal, and a control circuit for controlling internal components of the signal-processing semiconductor integrated circuit, in addition to the separation of the first group of circuits comprising the first mixer circuit and the first oscillation circuit from the second group of circuits comprising the second oscillation circuit, the amplification circuit and the demodulation circuit, it is desirable to place one of the second mixer circuit, the oscillation control circuit, the modulation circuit and the control circuit or any combination of the second mixer circuit, the oscillation control circuit, the modulation circuit and the control circuit between the first group of circuits and the second group of circuits. In this way, it is possible reduce the amount of wasted space and to reduce the deterioration of the CN caused by a spurious noise.

If there is further provided a third mixer circuit for converting the frequency of a signal generated as a result of the frequency conversion carried out by the first mixer circuit by mixing the signal with the second oscillation signal generated by the second oscillation circuit in a second-stage frequency conversion, it is preferable to separate the first group of circuits comprising the first mixer circuit and the first oscillation circuit from a third group of circuits comprising the second oscillation circuit, the amplification circuit, the demodulation circuit and the third mixer circuit. In this case, it is also nice to place one of the second mixer circuit, the oscillation control circuit, the modulation circuit and the control circuit or any combination of the second mixer circuit, the oscillation control circuit, the modulation circuit and the control circuit between the first group of circuits and the third group of circuits. In this way, even for a signal-processing LSI employed in a radio-communication system adopting the double super-heterodyne technique, it is possible to reduce the amount of wasted space on the semiconductor substrate and to reduce the deterioration of the CN caused by a spurious noise.

DETAILED DESCRIPTION OF THE PREFERRED EMBODIMENTS

Preferred embodiments of the present invention are explained by referring to the diagrams as follows.

Figure 1:
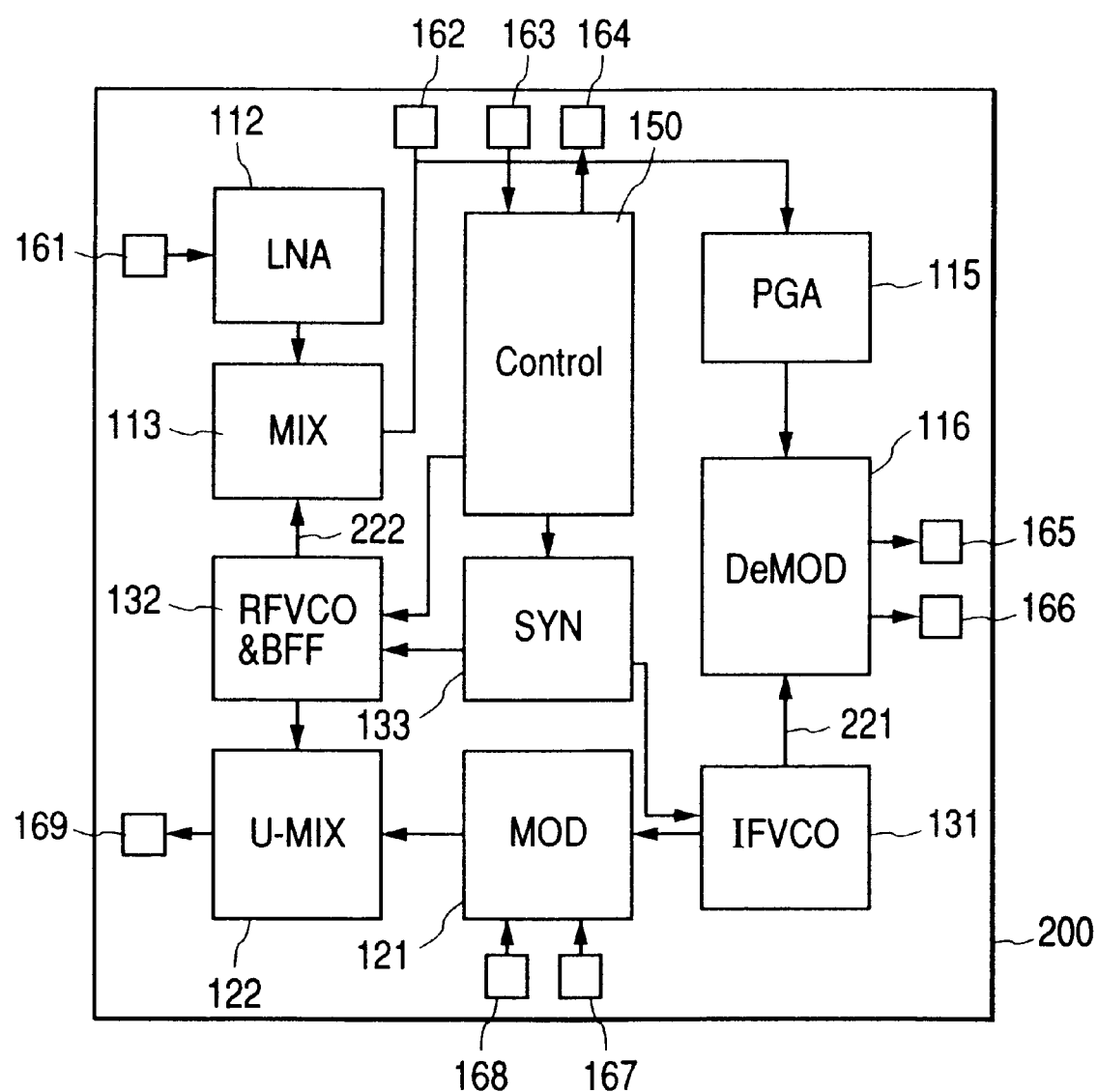
FIG. 1 is an explanatory diagram of a layout of an embodiment applying the present invention to a signal-processing LSI employed in a radio-communication system adopting a single super-heterodyne technique.
Figure 11:
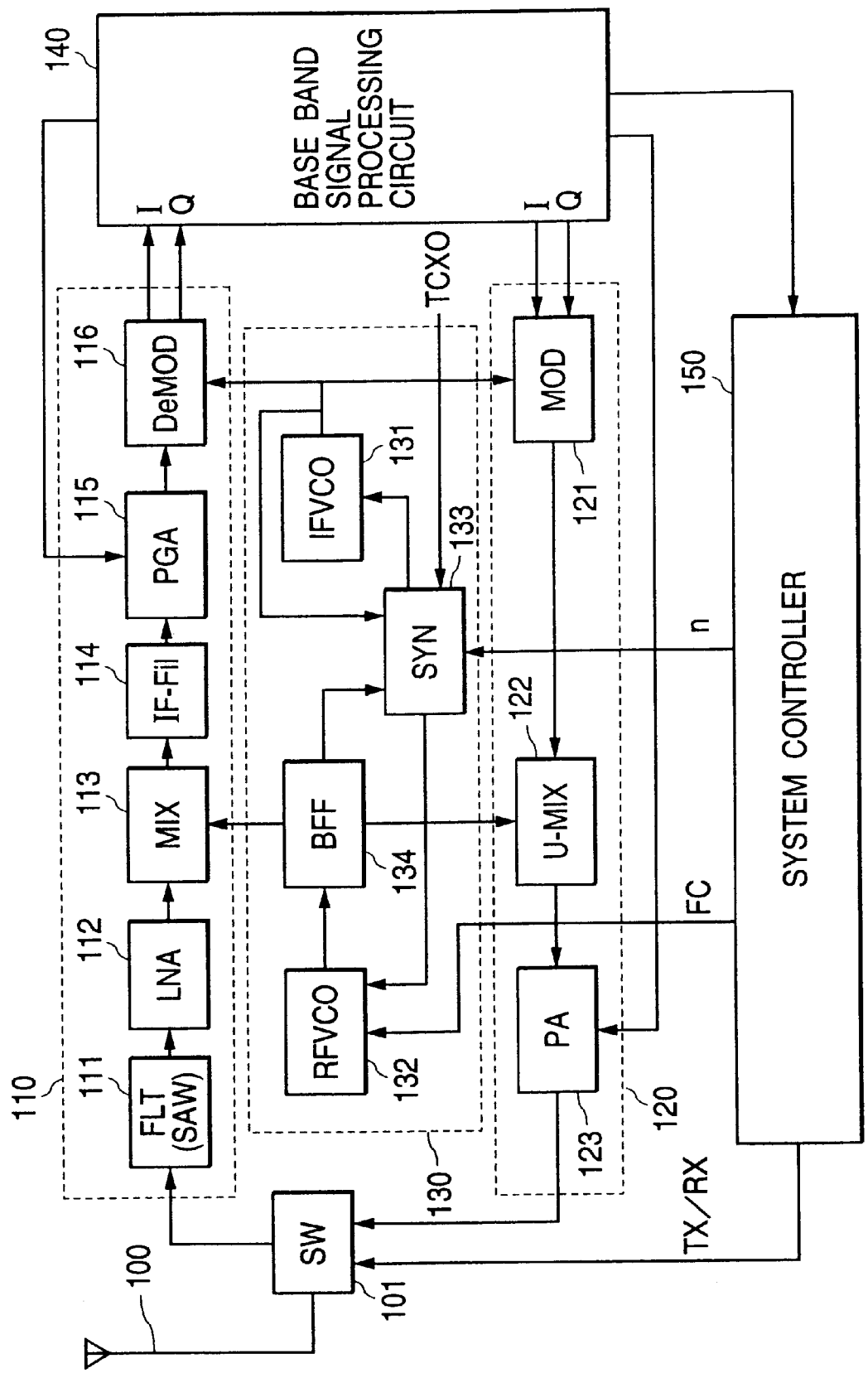
FIG. 11 is a block diagram showing the configuration of a radio-communication system adopting a super-heterodyne technique of a hand phone effectively applying the present invention.
Figure 12:
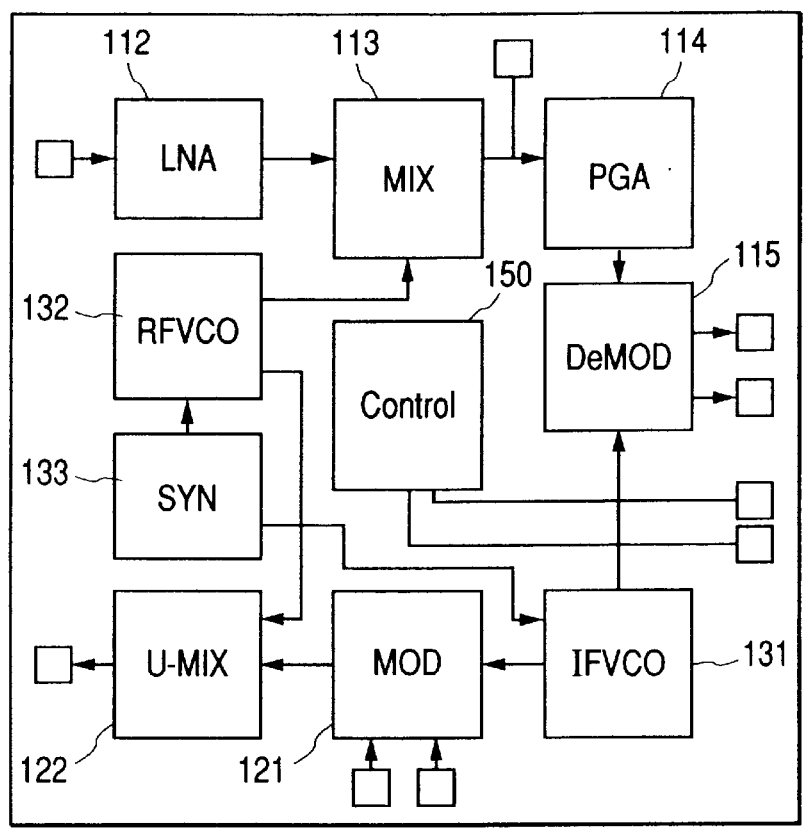
FIG. 12 is a diagram showing a top view of a typical layout of circuit blocks integrated as an LSI implemented as a single semiconductor chip comprising some of circuit blocks composing the radio-communication system of a hand phone shown in FIG. 11.
Figure 13:
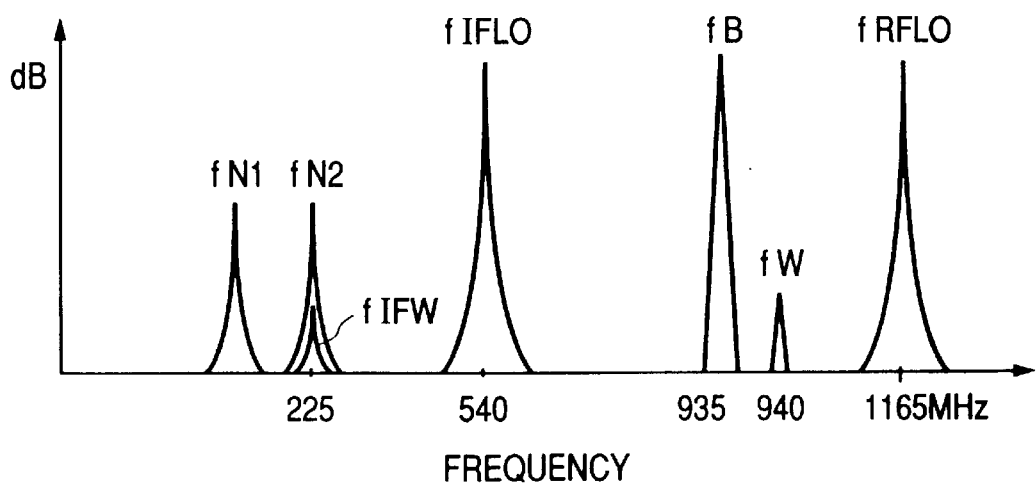
FIG. 13 is a diagram showing a frequency distribution of an interference wave and a desired wave with a deteriorated CN ratio caused by introduction of the interference wave to the radio-communication system of a hand phone shown in FIG. 11.

FIG. 1 is an explanatory diagram referred to in a description of a layout of an embodiment applying the present invention to a signal-processing semiconductor integrated circuit employed in a radio-communication system adopting a single super-heterodyne technique. The signal-processing semiconductor integrated circuit comprises the circuit blocks shown in FIG. 11. To be more specific, a single chip 200 implementing the signal-processing semiconductor integrated circuit includes the reception-system circuit 110 (excluding the band-limiting filter (FLT) 111 and the band-pass filter (BPF) 114), the transmission-system circuit 120 (excluding the power amplifier (PA) 123, the oscillation-system circuit 130 and the system controller 150) The layout of the circuit blocks is devised to reduce the number of spurious noises. The band-limiting filter (FLT) 111 and the band-pass filter (BPF) 114 are excluded since resistors and capacitors composing the filters would occupy a large area on the chip. Instead, additional discrete components are employed to serve as the band-limiting filter (FLT) 111 and the band-pass filter (BPF) 114. The power amplifier (PA) 123 is also excluded since it is a circuit that consumes power most and generates a large noise.

In this embodiment, as shown in FIG. 1, the low-noise amplification circuit (LNA) 112 and the down-conversion mixer (MIX) 113 of the reception system circuit, the radio-frequency voltage-controlled oscillation circuit (RFVCO) 132 of the oscillation system circuit are placed on one side of the chip 200. On the other hand, the demodulator (DeMOD) 116 of the reception system circuit and the intermediate-frequency voltage-controlled oscillation circuit (IFVCO) 131 of the oscillation system circuit are placed on the other side of the chip 200. In the middle of the chip 200 between these two sides, the system controller 150, the synthesizer (SYN) 133 of the oscillation system circuit and the modulator (MOD) 121 of the transmission system circuit are located. As described earlier, the synthesizer (SYN) 133 generates control voltages applied to the intermediate-frequency voltage-controlled oscillation circuit (IFVCO) 131 and the radio-frequency voltage-controlled oscillation circuit (RFVCO) 132 in accordance with feedback signals received from the intermediate-frequency voltage-controlled oscillation circuit (IFVCO) 131 and the radio-frequency voltage-controlled oscillation circuit (RFVCO) 132 respectively. It should be noted that, during a reception of a signal, the up-conversion mixer (U-MIX) 122 is not operating. During a transmission of a signal, on the other hand, the down-conversion mixer (MIX) 113 is not operating. For this reason, the radio-frequency voltage-controlled oscillation circuit (RFVCO) 132 is designed to function as an oscillator circuit for generating an oscillation signal to be mixed with a received signal in a down-conversion process as well as an oscillator circuit for generating an oscillation signal to be mixed with a signal to be transmitted in an up-conversion process. Thus, the radio-frequency voltage-controlled oscillation circuit (RFVCO) 132 includes the buffer (BFF) 134 of FIG. 11 for distributing the oscillation signals to the down-conversion mixer (MIX) 113 and the up-conversion mixer (U-MIX) 122. Instead of providing the radio-frequency voltage-controlled oscillation circuit (RFVCO) 132 for both reception and transmission as such, the oscillator circuit for generating an oscillation signal to be mixed with a received signal in a down-conversion process can be provided separately from the oscillator circuit for generating an oscillation signal to be mixed with a signal to be transmitted in an up-conversion process.

It should be noted that, since the up-conversion mixer (U-MIX) 122 is not considered to be a generator of spurious noises added to a received signal, the up-conversion mixer (U-MIX) 122 is placed on the same side as the down-conversion mixer (MIX) 113. Much like the up-conversion mixer (U-MIX) 122, the programmable-gain amplifier (PGA) 115 is not considered to be a generator of spurious noises added to a received signal and never functions incorrectly due to a noise from the demodulator (DeMOD) 116, the programmable-gain amplifier (PGA) 115 is located on the same side as the demodulator (DeMOD) 116 and the radio-frequency voltage-controlled oscillation circuit (IFVCO) 131 by consideration of the areas occupied by the circuit blocks and the geometrical shape of the chip.

In FIG. 1, reference numeral 161 denotes a pad for an external terminal for inputting a received signal and reference numeral 162 denotes a pad connected to a film capacitor. Reference numeral 163 is a pad for inputting a signal supplied to the system controller 150 from the base-band-processing circuit or the like and reference numeral 164 is a pad for outputting a signal generated by the system controller 150 to, for example, the transmission/reception changeover switch. Reference numerals 165 and 166 denote pads for outputting signals (I and Q) from the demodulator (DeMOD) 116 to the base-band-processing circuit. Reference numerals 167 and 168 denote pads for inputting signals (I and Q) from the base-band-processing circuit to the demodulator (DeMOD) 116. Reference numeral 169 denotes a pad for outputting a signal to be transmitted from the up-conversion mixer (U-MIX) 122.

In this embodiment, the radio-frequency voltage-controlled oscillation circuit (RFVCO) 132 for generating a local oscillation signal to be mixed with a received signal and the down-conversion mixer (MIX) 113 for mixing the local oscillation signal with the received signal on the left side are separated from the intermediate-frequency voltage-controlled oscillation circuit (IFVCO) 131 for generating a signal having an intermediate frequency and the demodulator (DeMOD) 116 using the signal having an intermediate frequency on the right side. In addition, the other circuit blocks such as the system controller 150, the synthesizer (SYN) 133 and the modulator (MOD) 121 are located between the left and right sides. Thus, even if the circuit blocks on the left side are coupled to the circuit blocks on the right side by a plurality insulating isolation capacitors, the coupling capacitance of the insulating isolation capacitors is extremely small since the insulation coupling capacitors are connected to each other in series. In this way, it is possible to reduce the quantity of cross talk propagated from the right side to components such as the down-conversion mixer (MIX) 113 and a signal wire 222 conveying an oscillation signal from the radio-frequency voltage-controlled oscillation circuit (RFVCO) 132 to the down-conversion mixer (MIX) 113 on the left side. On the right side, the cross talk is generated by an oscillation signal as well as its higher harmonics at components such as the intermediate-frequency voltage-controlled oscillation circuit (IFVCO) 131 and a signal wire 221 conveying the oscillation signal as well as its higher harmonics from the intermediate-frequency voltage-controlled oscillation circuit (IFVCO) 131 to the demodulator (DeMOD) 116. As a result, it is possible to reduce the quantity of the deterioration in CN ratio caused by spurious noises.

Figure 2:
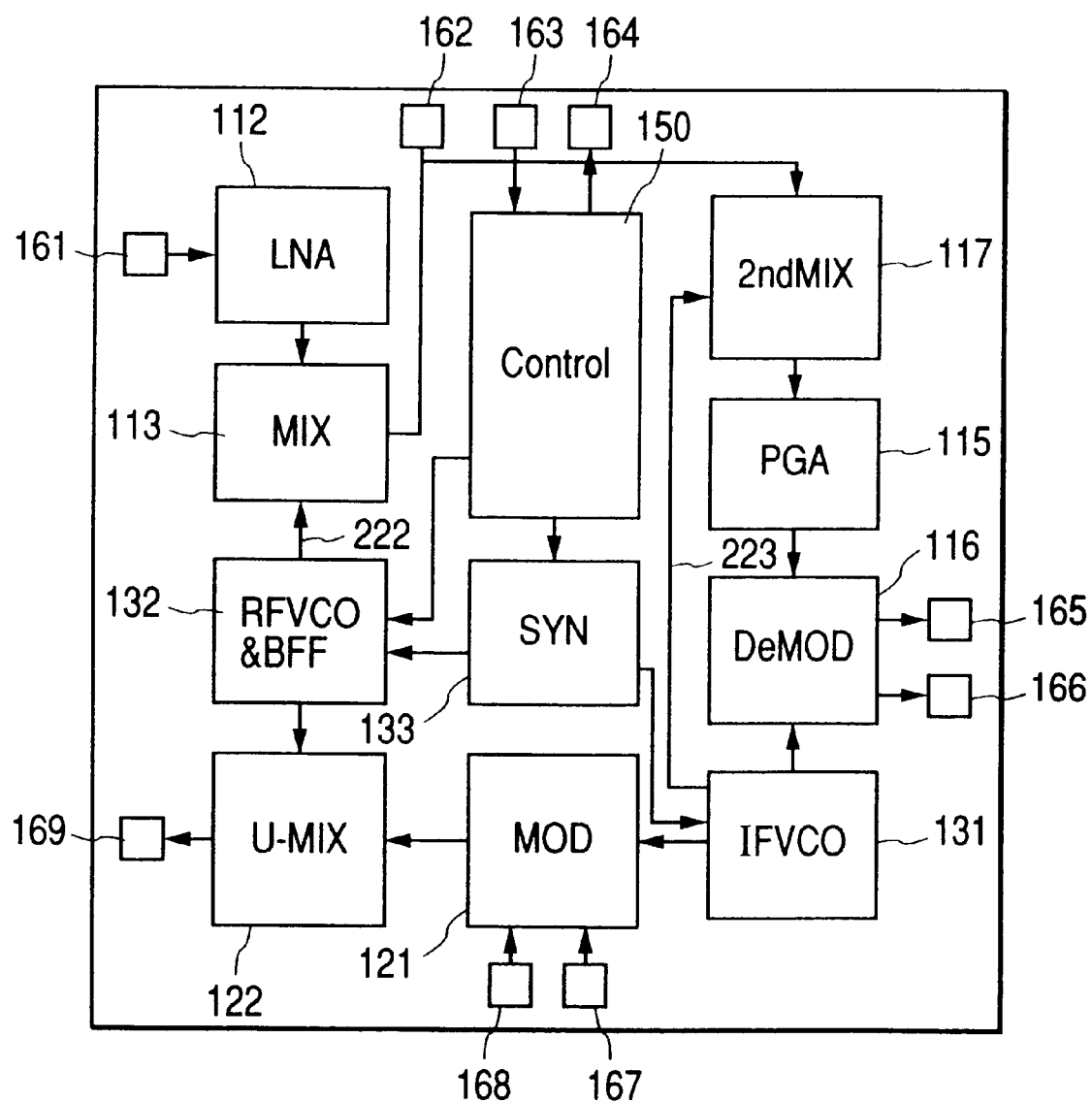
FIG. 2 is an explanatory diagram of an embodiment applying the present invention to another signal-processing LSI employed in a radio-communication system adopting a double super-heterodyne technique.

FIG. 2 is an explanatory diagram showing a layout of an embodiment applying the present invention to another signal-processing LSI employed in a radio-communication system adopting a double super-heterodyne technique. The LSI shown in FIG. 2 is different from the LSI shown in FIG. 1 in that the former adopts a double super-heterodyne technique while the latter adopts a single super-heterodyne technique. To be more specific, the LSI shown in FIG. 2 employs a second mixer 117 after the down-conversion mixer (MIX) 113. The second mixer 117 is used for further reducing the frequency of a signal completing a frequency down conversion in the down-conversion mixer (MIX) 113. The rest of the configuration of the LSI shown in FIG. 2 is all but identical with that of the LSI shown in FIG. 1. To put it in detail, in the embodiment shown in FIG. 2, the frequency of a received signal is reduced by the down-conversion mixer (MIX) 113 to a first intermediate frequency of typically 225 MHz by mixing the received signal with a 1,165-MHz local oscillation signal generated by the radio-frequency voltage-controlled oscillation circuit (RFVCO) 132. Then, the second mixer 117 further reduces the first intermediate frequency to a second intermediate frequency of typically 45 MHz by mixing the signal generated by the down-conversion mixer (MIX) 113 at the first intermediate frequency with a signal obtained as a result of a frequency division process carried out on an oscillation signal generated by the intermediate-frequency voltage-controlled oscillation circuit (IFVCO) 131 at a typical oscillation frequency of 1,080 MHz.

The inventors of the present invention have discovered the fact that a harmonic wave generated by the second mixer 117 is one of big causes of the deterioration in CN ratio due to introduction of a noise into the down-conversion mixer (MIX) 113 and the radio-frequency voltage-controlled oscillation circuit (RFVCO) 132 in a radio-communication circuit adopting the double super-heterodyne technique. The discovery was not expected at all at the development stage.

In order to solve the problem described above, in this embodiment, the second mixer 117 is placed on the side opposite to the side on which the down-conversion mixer (MIX) 113 and the radio-frequency voltage-controlled oscillation circuit (RFVCO) 132 are located. That is, the second mixer 117 is placed on the same side as the demodulator (DeMOD) 116 and the intermediate-frequency voltage-controlled oscillation circuit (IFVCO) 131. In this way, it is possible to reduce the quantity of cross talk propagated from the right side to components such as the down-conversion mixer (MIX) 113 and the signal wire 222 conveying an oscillation signal from the radio-frequency voltage-controlled oscillation circuit (RFVCO) 132 to the down-conversion mixer (MIX) 113 on the left side. In the case of the embodiment shown in FIG. 2, the cross talk is generated on the right side, by an oscillation signal as well as its higher harmonics at of course the intermediate-frequency voltage-controlled oscillation circuit (IFVCO) 131 in addition to components such as the second mixer 117, and a signal wire 223 conveying the oscillation signal as well as its higher harmonics from the intermediate-frequency voltage-controlled oscillation circuit (IFVCO) 131 to the second mixer 117. As a result, it is possible to reduce the quantity of the deterioration in CN ratio caused by spurious noises.

In both the embodiments shown in FIGS. 1 and 2, circuit blocks not generating spurious noises are placed in the middle of the chip to separate the radio-frequency voltage-controlled oscillation circuit (RFVCO) 132 and the down-conversion mixer (MIX) 113 from the intermediate-frequency voltage-controlled oscillation circuit (IFVCO) 131 and the demodulator (DeMOD) 116. Such circuit blocks include the system controller 150, the synthesizer (SYN)

133 and the modulator (MOD) 121. It should be noted, however, that circuit blocks placed in the middle of the chip are not limited to the system controller 150, the synthesizer (SYN) 133 and the modulator (MOD) 121. For example, in addition to the system controller 150, the synthesizer (SYN) 133 and the modulator (MOD) 121, the programmable-gain amplifier (PGA) 115 and the up-conversion mixer (U-MIX) 122 or any combination of them can also be placed between circuit blocks each considered to be most likely a noise generator and circuit blocks which may each be affected by noises.

Figure 3A:
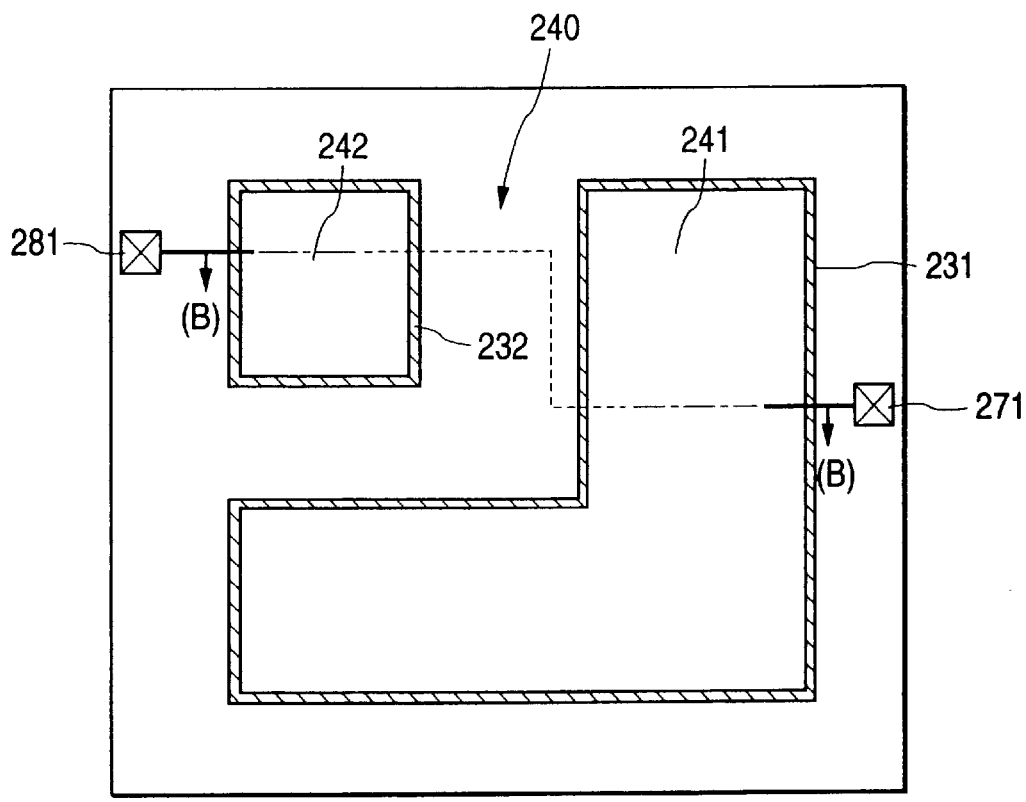
FIG. 3A is a diagram showing a top view of another embodiment of the present invention.
Figure 3B:
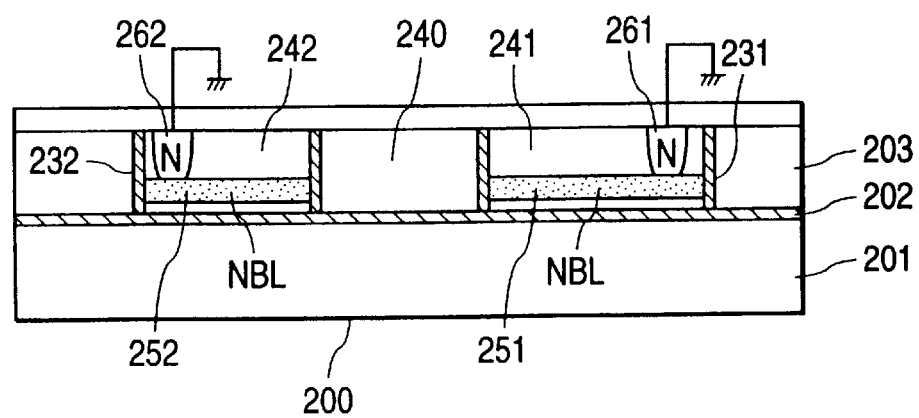
FIG. 3B is a diagram showing a cross section taken on line (B)—(B) in FIG. 3A.

FIG. 3A is a diagram showing a top view of another embodiment of the present invention and FIG. 3B is a diagram showing a cross section of the other embodiment.

In the case of this other embodiment, circuits created on a semiconductor substrate 200 are divided into at least two groups. To be more specific, the two groups respectively are created in two island areas 241 and 242, which are separated from each other as shown in FIG. 3A. The island areas 241 and 242 are respectively enclosed by groove-like isolation bands 231 and 232, each of which is a groove carved on the surface of the semiconductor substrate 200 and has insulating member embedded inside thereof. Typically, circuit blocks each considered to be an element most likely generating noises are placed in the island area 241 and circuit blocks each considered to be an element most likely affected by the noises are placed in the island area 242. As shown in FIG. 3B, a relatively-low-resistance embedded layer 251 and a draw area 261 connected to the relatively-low-resistance embedded layer 251 are provided in the island area 241. The draw area 261 applies a stable direct-current electric potential such as the ground electric potential to the relatively-low-resistance embedded layer 251. The resistance of the relatively-low-resistance embedded layer 251 is smaller than that of the island area 241. To be more specific, the sheet resistance of the relatively-low-resistance embedded layer 251 is smaller than that of the island area 241. In the same way, a relatively-low-resistance embedded layer 252 and a draw area 262 connected to the relatively-low-resistance embedded layer 252 are provided in the island area 242. Similarly, the draw area 262 applies a stable direct-current electric potential such as the ground electric potential to the relatively-low-resistance embedded layer 252. The resistance of the relatively-low-resistance embedded layer 252 is smaller than that of the island area 242. To be more specific, the sheet resistance of the relatively-low-resistance embedded layer 252 is smaller than that of the island area 242.

In the embodiment shown in FIGS. 3A and 3B, the semiconductor substrate 200 is typically an SOI substrate comprising a support substrate 201 and a monolithic-crystal silicon layer 203 created above the support substrate 201 in an epitaxial growth process with an embedded oxide film 202 sandwiched by the support substrate 201 and the monolithic-crystal silicon layer 203. It should be noted, however, that the semiconductor substrate 200 is not limited to this configuration. For example, the ordinary silicon chip can be used as the semiconductor substrate 200. By using an SOI substrate, however, the amount of noise propagating through the substrate can be reduced.

Figure 4:
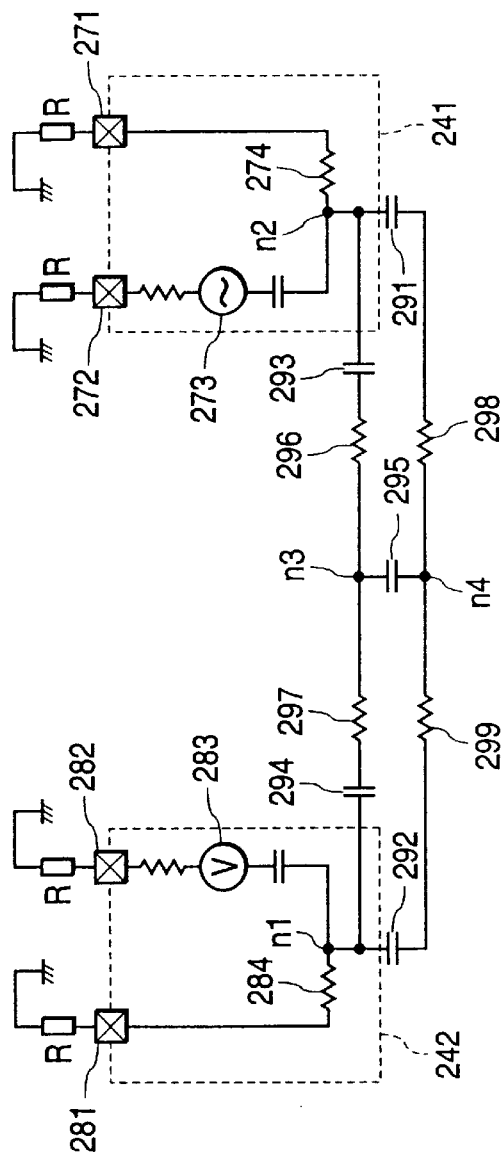
FIG. 4 is a diagram showing an equivalent circuit of the embodiment shown in FIG. 3.

FIG. 4 is a diagram showing an equivalent circuit of the embodiment shown in FIG. 3. In FIG. 4, reference numeral 271 denotes a terminal for applying the ground electric potential to the first island area 241. Reference numeral 272 denotes a terminal for applying the ground electric potential to circuits created on the first island area 241. Reference numeral 273 denotes an equivalent circuit of noise generators in the circuits created on the first island area 241. Reference numeral 274 denotes a base-substance resistor connected in series to the equivalent noise-generator equivalent circuit 273 between the terminal 271 and the terminal 272. Similarly, reference numeral 281 denotes a terminal for applying the ground electric potential to the second island area 242. Reference numeral 282 denotes a terminal for applying the ground electric potential to circuits created on the second island area 242. Reference numeral 283 denotes an equivalent circuit of elements affected by noises on the second island area 242. Reference numeral 284 denotes a base-substance resistor connected in series to the noise-affected-component equivalent circuit 283 between the terminal 281 and the terminal 282.

In addition, in FIG. 4, reference numeral 291 denotes a parasitic capacitor between the first island area 241 and the support substrate 201. Reference numeral 292 denotes a parasitic capacitor between the second island area 242 and the support substrate 201. Reference numeral 293 denotes a parasitic capacitor between the first island area 241 and an isolation area 240 between the first island area 241 and the second island area 242. Reference numeral 294 denotes a parasitic capacitor between the second island area 242 and the isolation area 240. Reference numeral 295 denotes a parasitic capacitor between the isolation area 240 and the support substrate 201. Reference numerals 296 and 297 each denote a parasitic resistor of the isolation area 240. Reference numerals 298 and 299 each denote a parasitic resistor of the support substrate 201.

With the configuration shown in FIG. 4, the smaller the resistance of the base-substrate resistor 274 of the first island area 241, the more stable the electric potential appearing at a node n1. Similarly, the smaller the resistance of the base-substrate resistor 284 of the second island area 242, the more stable the electric potential appearing at a node n2. Thus, the smaller the resistance of the base-substrate resistor 274 and the smaller the resistance of the base-substrate resistor 284, the fewer the noises generated by the first island area 241 and the more immune to incoming noises transmitted by external sources the second island area 242. By the way, the relatively-low-resistance embedded layer 251 is provided in the first island area 241 as is described in the explanation of the embodiment shown in FIG. 3. Thus, the resistance of the base-substrate resistor 274 decreases. As a result, the number of noises generated by the first island area 241 is also reduced as well. Similarly, the relatively-low-resistance embedded layer 252 is provided in the second island area 242. Thus, the resistance of the base-substrate resistor 284 decreases. As a result, the second island area 242 also becomes more immune against noises as well.

In the case of the embodiment shown in FIG. 3, neither the isolation area 240 nor the support substrate 201 is connected to a fixed electric potential. As is obvious from FIG. 4, the electric potentials appearing at nodes n3 and n4 are thus floating. It is therefore obvious that, the larger the resistance values of the parasitic resistor 296 and the parasitic resistor 297 of the isolation area 240 as well as the parasitic resistor 298 and the parasitic resistor 299 of the support substrate 201, the fewer the noises propagating from the first island area 241 to the second island area 242. The relatively-low-resistance embedded layer 251 and the relatively-low-resistance embedded layer 252 are provided in the first island area 241 and the second island area 242 respectively as is described in the explanation of the embodiment shown in FIG. 3 but no relatively-low-resistance embedded layer is provided in the isolation area 240. With this configuration, the resistance values of the parasitic resistor 296 and the parasitic resistor 297 increase accordingly, making it difficult for a noise to propagate. It should be noted, however, that a plurality of L-shaped groove-like isolation bands can be formed in parallel to each other in the entire isolation area 240. As an alternative, a groove-like isolation band can also be provided, being spread to form a lattice shape or a mesh shape in the isolation area 240.

It should be noted that the ground electric potential can be supplied from a common pad to the terminal 271 and the terminal 281 for applying the potential to the relatively-low-resistance embedded layer 251 and the relatively-low-resistance embedded layer 252 respectively and from a common pad to the terminal 272 and the terminal 282 for applying the potential to the first island area 241 and the second island area 242 respectively. It is desirable, however, to supply the ground electric potential to the terminal 271 and the terminal 281 for applying the potential to the relatively-low-resistance embedded layer 251 and the relatively-low-resistance embedded layer 252 respectively from separate pads and to supply the ground electric potential to the terminal 272 and the terminal 282 for applying the potential to the first island area 241 and the second island area 242 respectively also from separate pads. In addition, in the case of this embodiment, the ground electric potential is supplied to the terminal 271 and the terminal 281 to stabilize the electric potential of the relatively-low-resistance embedded layer 251 and the relatively-low-resistance embedded layer 252 respectively. It is worth noting, however, that the supplied electric potential for stabilization of an electric potential does not have to be the ground electric potential. That is to say, another electric potential such as a power-supply voltage Vcc can also be supplied as long as no problem is raised in the circuits.

The following description explains a concrete technique to create the relatively-low-resistance embedded layer 251 and the relatively-low-resistance embedded layer 252 in the first island area 241 and the second island area 242 respectively in the embodiment shown in FIG. 3.

Figure 5:
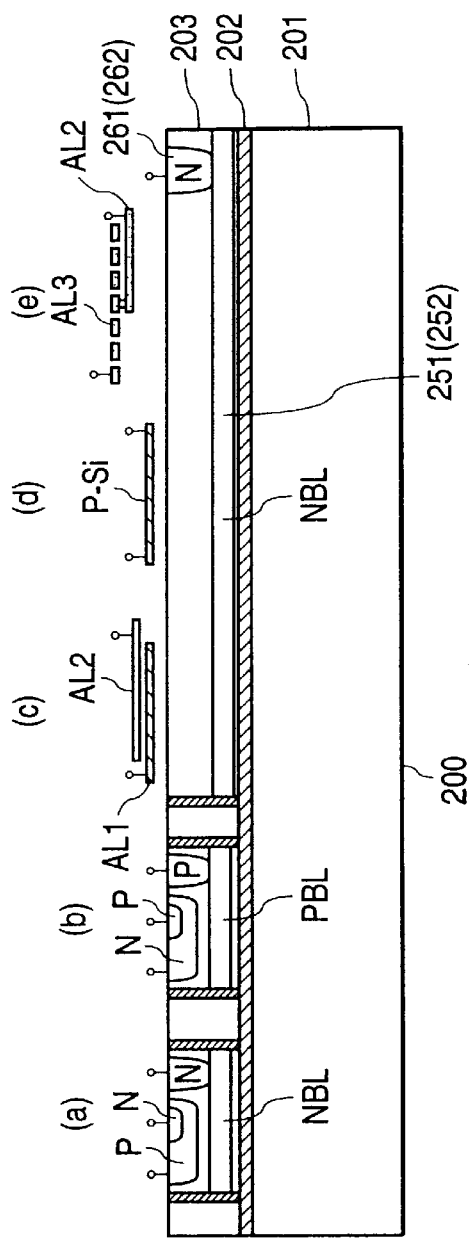
FIG. 5 is a diagram showing a concrete configuration of a relatively-low-resistance embedded layer of an island area in the embodiment shown in FIG. 3.

As described above, elements each considered to be a noise generator such as the intermediate-frequency voltage-controlled oscillation circuit (IFVCO) 131 and the demodulator (DeMOD) 116 are created in the first island area 241 while elements considered to be easily hurt by a bad effect of a noise, being most likely led to a malfunction such as the radio-frequency voltage-controlled oscillation circuit (RFVCO) 132 and the down-conversion mixer (MIX) 113 are formed in the second island area 242. By the way, in a semiconductor integrated circuit employing a bipolar transistor as an active device, a vertical-type transistor having an embedded collector NBL or PBL as shown in FIG. 5A or 5B respectively is used in order to improve device characteristics. If the intermediate-frequency voltage-controlled oscillation circuit (IFVCO) 131 and the demodulator (DeMOD) 116 in the island area 241 and the second island area 242 are created by using vertical-type transistors, the embedded collectors thereof are biased by the ordinary power-supply voltage or the ground electric potential in many cases.

On the other hand, passive devices such as capacitors, resistors and coils are created on an insulating film on the surface of the substrate from aluminum layers AL1, AL2 and AL3 and a poly-silicon layer P-Si in many cases as shown in FIGS. 5C, 5D and 5E. In the substrate area beneath the passive devices, that is, in the monolithic-crystal silicon layer 203 of the embodiment shown in FIG. 3, no devices are created as shown in FIGS. 5C, 5D and 5E. Thus, in this embodiment, in the monolithic-crystal silicon layer 203 where capacitors, resistors and coils are created but no other devices are, the relatively-low-resistance embedded layer 251 and the relatively-low-resistance embedded layer 252 described earlier as well as the draw area 261 and the draw area 262 connected to the relatively-low-resistance embedded layer 251 and the relatively-low-resistance embedded layer 252 respectively are provided, allowing the ground electric potential to be applied to the relatively-low-resistance embedded layer 251 and the relatively-low-resistance embedded layer 252 through the draw area 261 and the draw area 262 respectively so as to stabilize the electric potentials of the first island area 241 and the second island area 242 respectively.

Moreover, in this embodiment, the relatively-low-resistance embedded layer 251 and the relatively-low-resistance embedded layer 252 are created in the same process as the embedded collector NBL of the vertical-type NPN bipolar transistor shown in FIG. 5A. In addition, the draw area 261 and the draw area 262 connected to the relatively-low-resistance embedded layer 251 and the relatively-low-resistance embedded layer 252 respectively are created in the same process as an area called a collector draw area connected to the embedded collector NBL of the vertical-type NPN bipolar transistor. Thus, additional processes are not required.

It should be noted that, much like the coil shown in FIG. 5E, a wire is designed in a structure wherein no devices are created in the monolithic-crystal silicon layer 203 beneath the wire. Thus, the relatively-low-resistance embedded layer 251 and the relatively-low-resistance embedded layer 252 can be created in the monolithic-crystal silicon layer 203 in the same way. In addition, besides the circuits comprising only bipolar transistors, a circuit having MOSFETs or the so-called hybrid Bi-CMOS circuit including a combination of both bipolar transistors and MOSFETs may also be created in a chip. Also in this case, the relatively-low-resistance embedded layer 251 and the relatively-low-resistance embedded layer 252 are provided in the substrate area beneath the passive devices or a wire area, that is, in the monolithic-crystal silicon layer 203 of the embodiment shown in FIG. 3, and the ground electric potential is applied to the relatively-low-resistance embedded layer 251 and the relatively-low-resistance embedded layer 252 through the draw area 261 and the draw area 262 respectively so as to stabilize the electric potentials of the first island area 241 and the second island area 242 respectively. Particularly, in the case of a hybrid Bi-CMOS circuit, in the so-called well area where MOSFETs are created, relatively-low-resistance embedded layers similar to the relatively-low-resistance embedded layer 251 and the relatively-low-resistance embedded layer 252 are provided whereas draw areas are provided beneath electrodes for applying an electric potential to the well. In this way, the electric potential can be stabilized.

In addition, instead of creating the relatively-low-resistance embedded layer 251 and the relatively-low-resistance embedded layer 252 by using the same process as the embedded collector NBL of the vertical-type NPN bipolar transistor, the relatively-low-resistance embedded layer 251 and the relatively-low-resistance embedded layer 252 can also be created in the same process as the embedded collector PBL of the vertical-type PNP bipolar transistor. In the case of a hybrid Bi-CMOS circuit, in the so-called well area where P-channel MOSFETs are created, a relatively-low-resistance embedded layer is created in the same process as an embedded collector NBL as an N-type element. In the so-called well area where N-channel MOSFETs are created, on the other hand, a relatively-low-resistance embedded layer is created in the same process as an embedded collector PBL as a P-type element.

Figure 6:
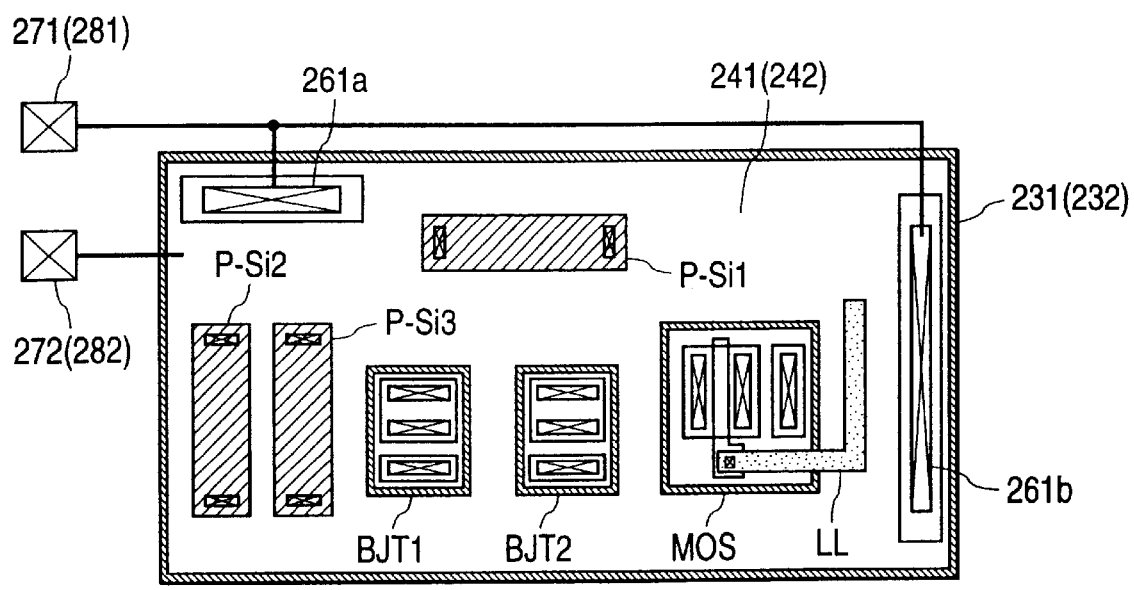
FIG. 6 is a diagram showing a planar layout of the island area in the embodiment shown in FIG. 3 in a simple and plain manner.

FIG. 6 is a diagram showing a planar layout of the island area 241 or 242 in the embodiment shown in FIG. 3 in a simple and plain manner. In FIG. 6, reference numeral 231 (or 232) denotes a groove-like isolation band created to enclose the island area 241 (or 242) whereas notations P-Si1 to P-Si3 each denote a poly-silicon member serving as a resistor. Notations BJT1 and BJT2 each denote a bipolar transistor whereas notation MOS denotes a MOSFET. Notation LL denotes a wire whereas reference numerals 261a and 261b each denote a draw area connected to a relatively-low-resistance embedded layer. Reference numeral 281 denotes a terminal for applying the ground electric potential to a relatively-low-resistance embedded layer in the first island area 241 (or 242). Reference numeral 282 denotes a terminal for applying the ground electric potential to a circuit created in the first island area 241 (or 242). In the layout shown in FIG. 6, a relatively-low-resistance embedded layer is created over the entire portion enclosed by the groove-like isolation band 231 (or 232) except regions occupied by the bipolar transistors BJT1 and BJT2 and the MOSFET MOS.

It should be noted that, in an application of the present embodiment to a signal-processing LSI comprising a plurality of circuit blocks integrated in a single semiconductor chip for implementing a radio-communication system for processing signals received and transmitted by adoption of the super-heterodyne technique, the technological concept adopted in the present embodiment can be combined with that of the embodiment explained earlier by referring to FIG. 1 or 2. That is, elements serving as the intermediate-frequency voltage-controlled oscillation circuit (IFVCO) 131 and the demodulator (DeMOD) 116 each considered to be a noise generator are created in the first island area 241, that is, one of the island areas shown in FIG. 3, while elements such as the mixer (MIX) 113 and the radio-frequency voltage-controlled oscillation circuit (RFVCO) 132 each considered to be easily hurt by a bad effect of a noise, being most likely led to a malfunction are created in the second island area 242, that is, the other island area shown in FIG. 3.

In this case, circuit blocks each regarded as neither a noise generator nor a device easily hurt by a bad effect of a noise, being most likely led to a malfunction may be created arbitrarily in either of the island areas. Such circuit blocks include the system controller 150, the synthesizer (SYN) 133, the modulator (MOD) 121, the up-conversion mixer (U-MIX) 122 and the programmable-gain amplifier (PGA) 115. It is desirable, however, to create all of them in either the same island area 241 of the intermediate-frequency voltage-controlled oscillation circuit (IFVCO) 131 and the demodulator (DeMOD) 116 or the same island area 242 of the down-conversion mixer (MIX) 113 and the radio-frequency voltage-controlled oscillation circuit (RFVCO) 132. The layout shown in FIG. 3 can be seen to represent an image in which the system controller 150, the synthesizer (SYN) 133, the modulator (MOD) 121, the up-conversion mixer (U-MIX) 122 and the programmable-gain amplifier (PGA) 115 are all created in the first island area 241.

Figure 7A:
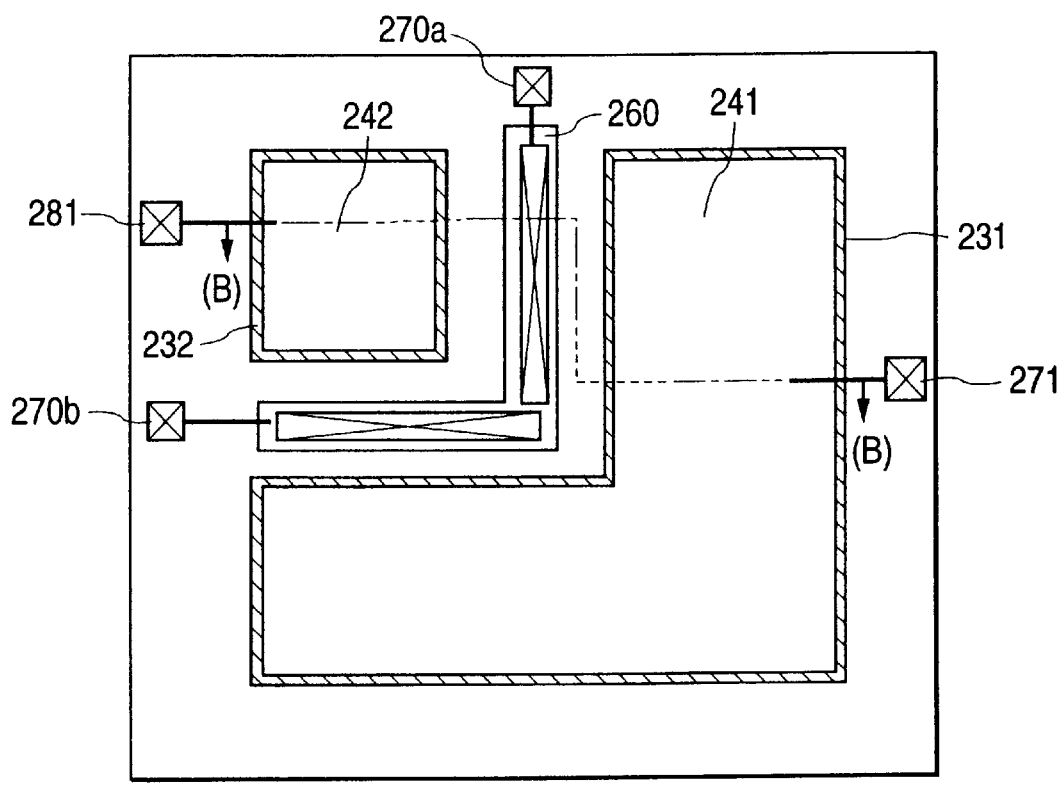
FIGS. 7A and 7B are diagrams respectively showing a top view and a cross-sectional view of another implementation of the second embodiment.
Figure 7B:
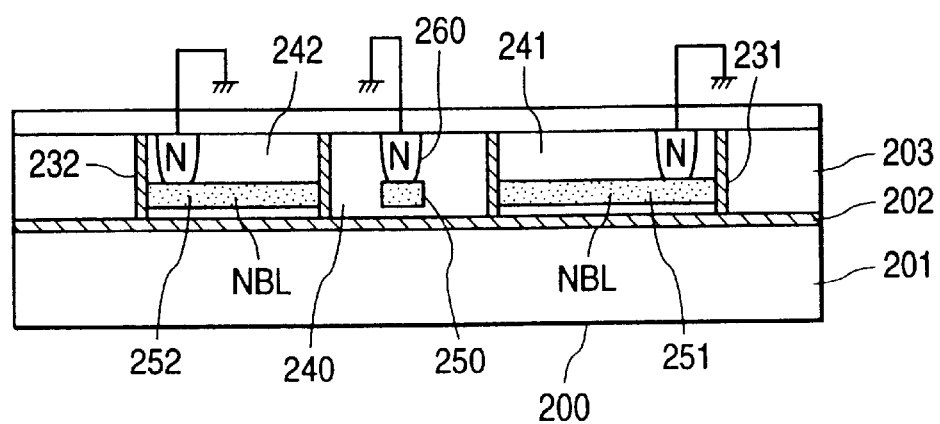

FIGS. 7A and 7B are diagrams respectively showing a top view and a cross-sectional view of another implementation of the second embodiment. To be more specific, FIG. 7B is a diagram showing a cross section at a location indicated by an arrow (B) in FIG. 7A.

This other implementation is obtained by providing a relatively-low-resistance embedded layer 250 and a draw area 260 in the isolation area 240 between the first island area 241 and the second island area 242 in the embodiment shown in FIG. 3. The ground electric potential is applied to a base-substance area (that is, the monolithic silicon layer 203) of the isolation area 240 between the first island area 241 and the second island area 242, in order to stabilize the electric potential. The resistance of the relatively-low-resistance embedded layer 250 is smaller than that of the isolation area 240. To be more specific, the sheet resistance of the relatively-low-resistance embedded layer 250 is smaller than that of the isolation area 240. In this embodiment, since the draw area 260 is long, it is desirable to provide pads 270a and 270b at both the ends of the draw area 260 respectively as shown in FIG. 7A. In this way, resistance values of parasitic resistors extended from the pads 270a and 270b to the relatively-low-resistance embedded layer 250 can be reduced, allowing the electric potential of the relatively-low-resistance embedded layer 250 to be sustained with a higher degree of stability.

Figure 8:
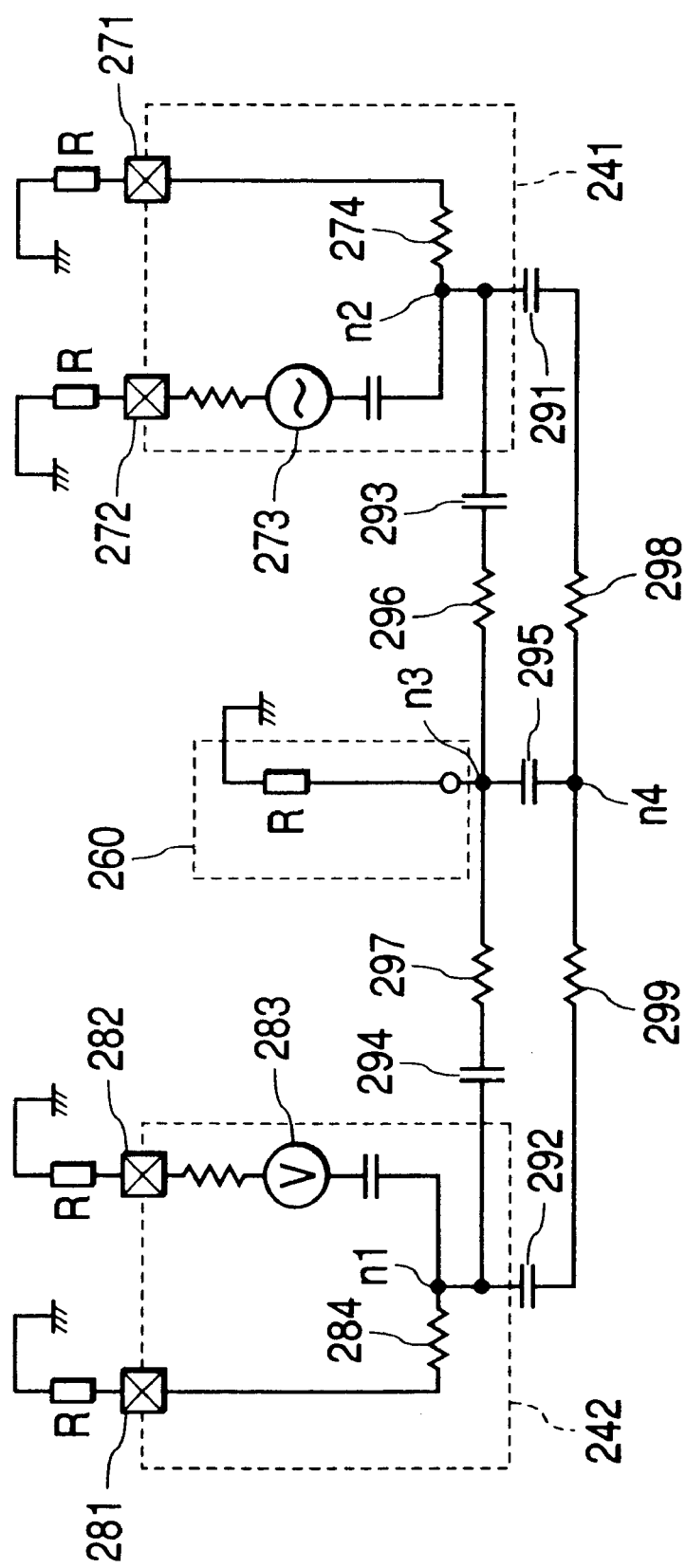
FIG. 8 is a diagram showing an equivalent circuit of the implementation shown in FIG. 7.

FIG. 8 is a diagram showing an equivalent circuit of the other implementation shown in FIG. 7. This equivalent circuit is all but identical with the equivalent circuit representing the embodiment of FIG. 3 as shown in FIG. 4. The only difference between the two is that, in the case of the equivalent circuit shown in FIG. 8, the electric potential of the isolation area 240 or the monolithic-crystal silicon layer 203, that is, the electric potential of a junction node n3 between base-substance resistors 296 and 297 is fixed at the ground potential. In the other implementation shown in FIG. 7, the relatively-low-resistance embedded layer 250 is provided in the isolation area 240 and fixed at the ground potential. Thus, the electric potential of the junction node n3 between the parasitic resistor 296 and the parasitic resistor 297 is stabilized. In addition, fluctuations of the electric potential appearing at a base-substance area, that is, fluctuations of the electric potential appearing at a node n4, are suppressed through a parasitic capacitor 295 between the base substance and a support substrate. As a result, there is offered a merit of fewer noises propagating from the first island area 241 to the second island area 242 by way of a base-substance area of the isolation area 240, that is, by way of the monolithic-crystal silicon layer 203. In an application of this other implementation to a signal-processing LSI comprising a plurality of circuit blocks integrated in a single semiconductor chip for implementing a radio-communication system for processing signals received and transmitted by adoption of the super-heterodyne technique, the technological concept adopted in this other implementation can be combined with that of the embodiment explained earlier by referring to FIG. 1 or 2.

Figure 9A:
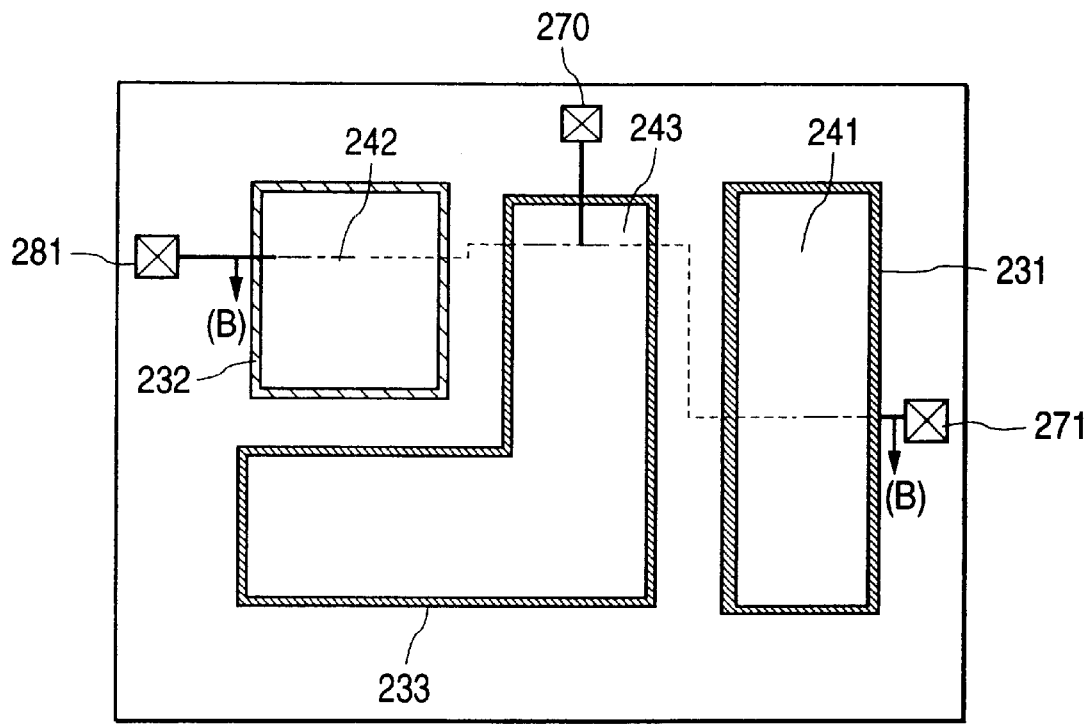
FIGS. 9A and 9B are diagrams respectively showing a top view and a cross-sectional view of a further implementation of the second embodiment.
Figure 9B:
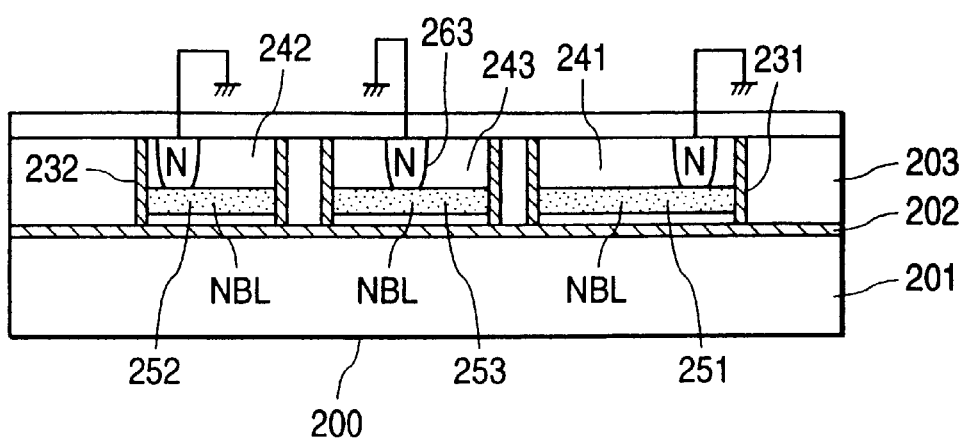

FIGS. 9A and 9B are diagrams respectively showing a top view and a cross-sectional view of a further implementation of the second embodiment. To be more specific, FIG. 9B is a diagram showing a cross section taken along (B)—(B) in FIG. 9A.

In this further implementation, a third island area 243 enclosed by a groove-like isolation band 233 between the first island area 241 and the second island area 242 in the embodiment shown in FIG. 3 or the other implementation shown in FIG. 7 in order to farther separate the first island area 241 and the second island area 242 from each other. Circuit blocks each regarded as neither a noise generator nor a device easily hurt by a bad effect of a noise, being most likely led to a malfunction are created in the third island area 243.

In addition, in this further implementation, a relatively-low-resistance embedded layer 253 and a draw area 263 are provided in the third island area 243 as shown in FIG. 9B. A stable direct-current electric potential such as the ground electric potential is applied to the relatively-low-resistance embedded layer 253. It should be noted that, much like the first island area 241 and the second island area 242 employed in the embodiment of FIG. 3 and explained earlier by referring to FIG. 5, the relatively-low-resistance embedded layer 253 provided in the third island area 243 is created in regions (or locations) for creating passive components such as resistors, capacitors, coils and wires outside regions for creating active components such as bipolar transistors and MOSFETs.

Figure 10:
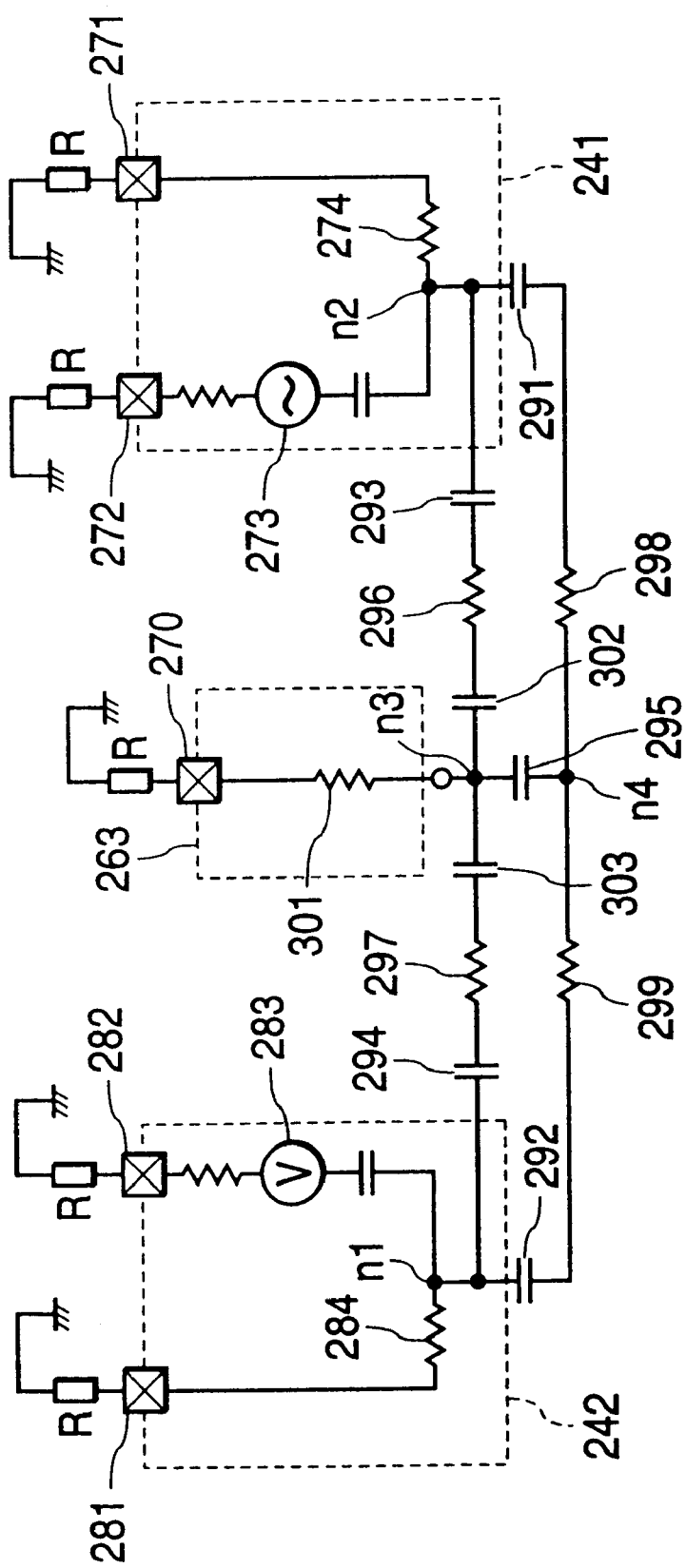
FIG. 10 is a diagram showing an equivalent circuit of the further implementation shown in FIG. 9.

FIG. 10 is a diagram showing an equivalent circuit of the further implementation shown in FIG. 9. This equivalent circuit is all but identical with the equivalent circuit representing the embodiment of FIG. 7 as shown in FIG. 8. The equivalent circuit shown in FIG. 10 is different from the equivalent circuit shown in FIG. 8 in that the equivalent circuit shown in FIG. 10 has the following two characteristics. In the first place, a parasitic resistor 301 of the relatively-low-resistance embedded layer 253 created in the third island area 243 in the middle of the semiconductor IC chip is placed between a terminal 270 for applying the ground potential to the draw area 263 connected to the relatively-low-resistance embedded layer 253 and the junction node n3 of a capacitor 295 between base-substance area (or the monolithic-crystal silicon layer 203 shown in FIG. 9) and the support substrate 200 shown in FIG. 9. In the second place, parasitic capacitors 302 and 303 each having the groove-like isolation band 233 as the dielectric material thereof are connected to each other in series, being sandwiched by a parasitic resistor 296 of the base-substance area between the first island area 241 and the third island area 243 and by a parasitic resistor 297 of the base-substance area between the second island area 242 and the third island area 243.

As is obvious from FIG. 10, in the further implementation shown in FIG. 9, the more stable the electric potential of the junction node n3, the fewer the noises propagating through the base-substance area (or the monolithic-crystal silicon layer 203) from the first island area 241 to the second island area 242. By the way, in the further implementation shown in FIG. 9, circuit blocks each regarded as neither a noise generator nor a device easily hurt by a bad effect of a noise, being most likely led to a malfunction are created in the third island area 243 between the first island area 241 and the second island area 242, and the relatively-low-resistance embedded layer 253 as well as the draw area 263 for applying the ground electric potential to the relatively-low-resistance embedded layer 253 are provided in the base-substance area (or the monolithic-crystal silicon layer 203) for the third island area 243. Thus, the electric potential of the junction node n3 is stable and, in addition, the first island area 241 and the second island area 242 are farther separated from each other by the third island area 243. As a result, this further implementation offers a merit of fewer noises propagating from the first island area 241 to the second island area 242.

It should be noted that, while there is no parasitic resistor of the relatively-low-resistance embedded layer 250 created in the isolation area 240 attached to the junction node n3 in the case of the other implementation shown in FIG. 7, there exists the parasitic resistor 301 of the relatively-low-resistance embedded layer 253 created in the third island area 243 attached to the junction node n3 in the case of the further implementation shown in FIG. 9. This is because the draw area 260 for applying the ground electric potential to the relatively-low-resistance embedded layer 250 in the other implementation shown in FIG. 7 is larger than the draw area 263 for applying the ground electric potential to the relatively-low-resistance embedded layer 253 in the further implementation shown in FIG. 9. Thus, if there is a margin in the area of the chip, from the noise-reduction point of view, it is desirable to provide a configuration including the isolation area 240 as shown in FIG. 7. If there is no margin in the area of the chip, on the other hand, it is desirable to provide a configuration including the third island area 243 for accommodating circuit blocks each regarded as neither a noise generator nor a device easily hurt by a bad effect of a noise, being most likely led to a malfunction as shown in FIG. 9.

In an application of this further implementation to a signal-processing LSI comprising a plurality of circuit blocks integrated in a single semiconductor chip for implementing a radio-communication system for processing signals received and transmitted by adoption of the superheterodyne technique, the technological concept adopted in this further implementation can be combined with that of the embodiment explained earlier by referring to FIG. 1 or 2. In this case, elements each considered to be a noise generator such as the intermediate-frequency voltage-controlled oscillation circuit (IFVCO) 131 and the demodulator (DeMOD) 116 are created in the first island area 241 while elements considered to be easily hurt by a bad effect of a noise, being most likely led to a malfunction such as the radio-frequency voltage-controlled oscillation circuit (RFVCO) 132 and the down-conversion mixer (MIX) 113 are formed in the second island area 242. Elements each regarded as neither a noise generator nor a device easily hurt by a bad effect of a noise, being most likely led to a malfunction such as the system controller 150, the synthesizer (SYN) 133, the modulator (MOD) 121, the up-conversion mixer (U-MIX) 122 and the programmable-gain amplifier (PGA) 115 are created in the third island area 243.

In the embodiments described above, the electric potential of the support substrate 201 is floating. It should be noted, however, that the electric potential of the support substrate 201 can of course be set at a fixed value. In this case, in order to reduce the number of spurious noises, it is desirable to reduce the resistance values of the parasitic resistor 298 and the parasitic resistor 299 by increasing an impurity concentration of the support substrate 201, or to provide a fixed electric potential totally from the back surface of the support substrate 201. A configuration wherein a fixed electric potential is provided totally from the back surface of the support substrate 201 as such can be applied with ease to sealing by means of a package of a type allowing the back surface of the chip to be connected to a mounting substrate by a low impedance. Examples of such a package include a flip-chip package and a die-pad-exposure package.

In addition, the configuration wherein a fixed electric potential is provided totally from the back surface of the support substrate 201 is conceivably applicable to sealing by means of a plastic package in some cases. Thus, this configuration may be applied to a case in which it is desirable to reduce the cost my using a plastic package.

In the embodiment and the other implementation shown in FIGS. 3 and 7 respectively, the second island area 242 is laid out to form a shape resembling the character. It is worth noting, however, that the scope of the present invention is not limited by the embodiment and this other implementation. By properly devising a layout of circuit blocks, the first island area 241 and the second island area 242 can each be created into a vertical or horizontal all but rectangular shape.

Similarly, the isolation area 240 between the first island area 241 and the second island area 242 can be created into a vertical or horizontal rectangular shape. Likewise, in the further implementation shown in FIG. 9, the third island area 243 is laid out to form a shape resembling the L character. It is to be noted, however, that the first island area 241, the second island area 242 and the third island area 243 can each be created into a vertical or horizontal rectangular shape. In addition, the other implementation shown in FIG. 7 can be combined with the further implementation shown in FIG. 9. Furthermore, while the embodiments and the implementations each employ an SOI substrate as the semiconductor substrate, an ordinary silicon substrate can also be used in applications of the present invention and the same effects can yet be expected.

As described above, the invention discovered by the inventors is applied to a signal-processing LSI employed in a radio-communication system of a hand phone adopting the super-heterodyne technique in an application field serving as a background of the invention. It should be noted, however, that the scope of the present invention is not limited to such an application. For example, the present invention can also be applied to a broad range of signal-processing LSIs employing a plurality of oscillation circuits wherein one of the oscillation circuits is used for generating an oscillation signal mixed with a received signal in a frequency conversion process.

An effect exhibited by representatives of the invention disclosed in this specification is described briefly as follows.

In accordance with the present invention, in a signal-processing semiconductor integrated circuit for carrying out signal processing by mixing a received signal with a local oscillation signal in a frequency conversion process, there is exhibited an effect to reduce a deterioration in CN ratio caused by a spurious noise.

What is claimed is:

1. A semiconductor integrated circuit comprising:
   a first semiconductor region;
   a second semiconductor region disposed on a surface of said first semiconductor region via a first isolation region, wherein said second semiconductor region includes a first island area enclosed by an isolation band and a second island area enclosed by an isolation band;
   a first circuit block created in said first island area;
   a second circuit block created in said second island area;
   a third semiconductor region which is created in a semiconductor region of said first island area, to which a predetermined voltage is applied, and which has a resistance lower than that of the semiconductor region of said first island area; and
   a fourth semiconductor region which is created in a semiconductor region of said second island area, to which a predetermined voltage is applied, and which has a resistance lower than that of the semiconductor region of said second island area.

2. A semiconductor integrated circuit according to claim 1, wherein the second semiconductor region has a semiconductor region disposed between said first island area and said second island area.

3. A semiconductor integrated circuit according to claim 2, wherein the semiconductor region of said first island area has a first area in which said third semiconductor region is created, and a second area which is separated from the first area in a location and which an element for the first circuit block, and wherein the semiconductor region of said second island area has a first area in which said fourth semiconductor region is created, and a second area which is separated from the first area in a location and which an element for the second circuit block.

4. A semiconductor integrated circuit according to claim 3, wherein the predetermined voltage to be applied to the third semiconductor region is substantially equal to the predetermined voltage to be applied to the fourth semiconductor region.

5. A semiconductor integrated circuit according to claim 4, wherein said element is a bipolar transistor.

6. A semiconductor integrated circuit comprising:
   a first semiconductor region;
   a second semiconductor region disposed on a surface of said first semiconductor region via a first isolation region, wherein said second semiconductor region includes a first island area enclosed by an isolation band and a second island area enclosed by an isolation band;
   a first circuit block created in said first island area;
   a second circuit block created in said second island area;
   a third semiconductor region which is created in a semiconductor region of said first island area, to which a predetermined voltage is applied, and which has a resistance lower than that of the semiconductor region of said first island area.

7. A semiconductor integrated circuit according to claim 6, wherein the second semiconductor region has a semiconductor region disposed between said first island area and said second island area.

8. A semiconductor integrated circuit according to claim 7, wherein the semiconductor region of said first island area has a first area in which said third semiconductor region is created, and a second area which is separated from the first area in a location and which an element for the first circuit block.

9. A semiconductor integrated circuit comprising:
   a first semiconductor region;
   a second semiconductor region disposed on a surface of said first semiconductor region via a first isolation region, wherein said second semiconductor region includes a first island area enclosed by an isolation band and a second island area enclosed by an isolation band;
   a first circuit block created in said first island area;
   a second circuit block created in said second island area;
   a third semiconductor region which is created in the semiconductor region disposed between said first island area and said second island area, to which a predetermined voltage is applied, and which has a resistance lower than that of the second semiconductor.

10. A semiconductor integrated circuit according to claim 9, wherein a semiconductor region of said first island area has a fourth semiconductor region which a predetermined voltage is applied and which has a resistance lower than that of the semiconductor region of said first island area.

11. A semiconductor integrated circuit according to claim 10, wherein the predetermined voltage to be applied to the third semiconductor region is substantially equal to the predetermined voltage to be applied to the fourth semiconductor region.

12. A signal-processing semiconductor integrated circuit comprising:
   a first oscillation circuit generating a first oscillation signal and a second oscillation signal;

a second oscillation circuit generating a third oscillation signal;

an oscillation control circuit generating control voltages to be applied to said first oscillation circuit and said second oscillation circuit;

a first mixer circuit converting a frequency of signal from an antenna by using said first oscillation signal;

an amplification circuit amplifying an output signal from said first mixer;

a demodulation circuit demodulating an output signal from said amplification circuit by using said third oscillation signal;

a second mixer circuit converting a frequency of a signal to a frequency of a signal to be transmitted by said antenna by using said second oscillation signal, wherein a first group of circuits and a second group of circuits are mounted on a semiconductor region, wherein the first group of circuits are separated from the second group of circuits in a location, wherein the first group of circuits includes a said first mixer circuit and said first oscillation circuit, and wherein the second group of circuits includes said second oscillation circuit, said amplification circuit and said demodulation circuit.

13. A signal-processing semiconductor integrated circuit according to claim 12, wherein said first mixer circuit and said first oscillation circuit are formed in a first island area which is disposed on said semiconductor region via an isolation region and which is enclosed by an isolation band, wherein said second oscillation circuit, said amplification circuit and said demodulation circuit are formed in a second island area which is disposed on said semiconductor region via said isolation region and which is enclosed by an isolation band, and wherein said first island area includes a second semiconductor region which has a resistance lower than that of the semiconductor region of the first island area and to which a predetermined voltage is applied.

14. A signal-processing semiconductor integrated circuit according to claim 13, wherein said second island area includes a third semiconductor region which as a resistance lower than that of the semiconductor region of the second island area and to which a predetermined voltage is applied.

15. A signal-processing semiconductor integrated circuit according to claim 14, further comprising a fourth semiconductor region which is formed in a semiconductor region between the first island area and the second island area, which has a resistance lower than that of the semiconductor region between the first island area and the second island area and to which a predetermined voltage is applied.

16. A signal-processing semiconductor integrated circuit according to claim 13, further comprising a fourth semiconductor region which is formed in a semiconductor region between the first island area and the second island area, which has a resistance lower than that of the semiconductor region between the first island area and the second island area and to which a predetermined voltage is applied.

* * * * *